US012382686B2

(12) United States Patent  
Lin et al.

(10) Patent No.: US 12,382,686 B2  
(45) Date of Patent: Aug. 5, 2025

(54) HIGH-VOLTAGE SEMICONDUCTOR DEVICE AND METHOD OF FORMING THE SAME

(71) Applicant: Vanguard International Semiconductor Corporation, Hsinchu (TW)

(72) Inventors: Wen-Hsin Lin, Hsinchu County (TW); Shin-Chen Lin, Tainan (TW); Yu-Hao Ho, Keelung (TW); Cheng-Tsung Wu, Taipei (TW); Chiu-Hao Chen, Miaoli County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 597 days.

(21) Appl. No.: 17/846,038

(22) Filed: Jun. 22, 2022

(65) Prior Publication Data

US 2022/0320289 A1     Oct. 6, 2022

Related U.S. Application Data

(62) Division of application No. 17/003,946, filed on Aug. 26, 2020, now Pat. No. 11,398,552.

(51) Int. Cl.
*H10D 62/13*        (2025.01)
*H01L 21/265*        (2006.01)
(Continued)

(52) U.S. Cl.
CPC ..... *H10D 62/158* (2025.01); *H01L 21/26513* (2013.01); *H01L 21/266* (2013.01); *H10D 30/0281* (2025.01); *H10D 30/603* (2025.01); *H10D 30/65* (2025.01); *H10D 62/116* (2025.01); *H10D 62/154* (2025.01); *H10D 62/157* (2025.01); *H10D 62/159* (2025.01)

(58) Field of Classification Search
CPC .. H10D 30/65; H10D 62/158; H10D 30/0281; H10D 62/154; H10D 30/0221; H10D 30/603; H10D 30/605; H10D 62/157; H01L 21/2652

See application file for complete search history.

(56) References Cited

U.S. PATENT DOCUMENTS 6,198,131 B1    3/2001    Tung
6,465,307 B1   10/2002    Chidambaram
(Continued)

FOREIGN PATENT DOCUMENTS

WO     2014/044748 A1     3/2014

*Primary Examiner* — Aaron J Gray
*Assistant Examiner* — Warwick R Steer
(74) *Attorney, Agent, or Firm* — Winston Hsu

(57) ABSTRACT

High-voltage semiconductor device and method of forming the same, the high-voltage semiconductor device includes a substrate, a gate structure, a drain, a first insulating structure and a drain doped region. The gate structure is disposed on the substrate. The drain is disposed in the substrate, at one side of the gate structure. The first insulating structure is disposed on the substrate, under the gate structure to partially overlap with the gate structure. The drain doped region is disposed in the substrate, under the drain and the first insulating structure, and the drain doped region includes a discontinuous bottom surface.

16 Claims, 6 Drawing Sheets

(51) Int. Cl.
    *H01L 21/266*    (2006.01)
    *H10D 30/01*     (2025.01)
    *H10D 30/60*     (2025.01)
    *H10D 30/65*     (2025.01)
    *H10D 62/10*     (2025.01)

(56) References Cited

U.S. PATENT DOCUMENTS

| | | |
|---|---|---|
| 7,626,233 B2 | 12/2009 | Tornblad |
| 9,269,808 B2 | 2/2016 | Lin |
| 2001/0038122 A1 | 11/2001 | Matsuzaki |
| 2009/0230468 A1* | 9/2009 | Cai .................... H10D 84/0128 |
| | | 257/337 |
| 2010/0123195 A1 | 5/2010 | Lee |
| 2011/0198690 A1 | 8/2011 | Hu |
| 2012/0299093 A1 | 11/2012 | Kim |
| 2013/0228873 A1 | 9/2013 | Tseng |
| 2014/0061788 A1 | 3/2014 | Chen |
| 2015/0243780 A1 | 8/2015 | Lin |
| 2017/0213893 A1 | 7/2017 | Edwards |
| 2017/0222050 A1 | 8/2017 | Chen |
| 2018/0190816 A1 | 7/2018 | Siddiqui |
| 2019/0058039 A1 | 2/2019 | Cai |
| 2019/0348533 A1 | 11/2019 | Huang |
| 2019/0371896 A1* | 12/2019 | Wang ................ H01L 21/76202 |
| 2020/0043801 A1 | 2/2020 | Kim |
| 2020/0203475 A1 | 6/2020 | Imam |

\* cited by examiner

HIGH-VOLTAGE SEMICONDUCTOR DEVICE AND METHOD OF FORMING THE SAME

CROSS REFERENCE TO RELATED APPLICATIONS

This application is a division of U.S. application Ser. No. 17/003,946, filed on Aug. 26, 2020. The content of the application is incorporated herein by reference.

BACKGROUND OF THE INVENTION

1. Field of the Invention

The present disclosure relates to a semiconductor device and a method of forming the same, and more particularly, to a high-voltage semiconductor device and a method of forming the same.

2. Description of the Prior Art

With improvement in semiconductor manufacturing, it is conceivable to fabricate control circuits, memories, low-voltage circuits, high-voltage circuits, and the related devices in a single chip for reducing costs and improving performance. And a MOS transistor device which is widely applied for enlarging currents or signals in a circuit, serving as an oscillator of a circuit, or serving as a switch device of a circuit, is further applied to be the high-power device or the high-voltage device based on the development of semiconductor processes. For example, a MOS transistor device, serving as a high-voltage device, is applied in between the internal circuits and the I/O terminals for preventing a large number of charges from suddenly spiking into the internal circuits and thus to avoid the resulted damage to the internal circuit.

Among the current MOS transistors which are configured as high-voltage device, the structure of these MOS transistors roughly include a double diffused drain MOS (DDD-MOS) with a drift region, a laterally diffused drain MOS ((LDMOS), and the like, to reduce the lateral electric field thereof, and then achieving the effect of increasing the breakdown voltage (Vth) thereby. However, it is still a main subject to further increase the breakdown voltage of the high-voltage semiconductor device in order to meet the practical requirements of the industry.

SUMMARY OF THE INVENTION

The present disclosure provides a high-voltage semiconductor device and a method of forming the same. The high-voltage semiconductor device includes a doped region disposed at the high-voltage side, and the doped region includes a discontinuous bottom surface, so as to have both functions of improving the hot carrier injection issue and avoiding the dropping of breakdown voltage (Vth). Thus, the device reliability of the high-voltage semiconductor is sufficiently enhanced. The above description is only one of the purposes of the present disclosure and it is not intended to limit the scope of present disclosure.

To achieve the purpose described above, one embodiment of the present disclosure provides a high-voltage semiconductor device including a substrate, a gate structure, a drain, a first insulating structure and a drain doped region. The gate structure is disposed on the substrate, and the drain is disposed in the substrate, at one side of the gate structure. The first insulating structure is disposed on the substrate, under the gate structure and partially overlapped with the gate structure. The drain doped region is disposed in the substrate, under the drain and the first insulating structure, wherein the drain doped region includes a discontinuous bottom surface.

To achieve the purposed described above, one embodiment of the present disclosure provides a method of forming a high-voltage semiconductor device including the following steps. Firstly, a substrate is provided, and an insulating structure is formed on the substrate. Next, a drain doped region is formed in the substrate, wherein the drain doped region includes a discontinuous bottom surface under the insulating structure. Then, a gate structure is formed on the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
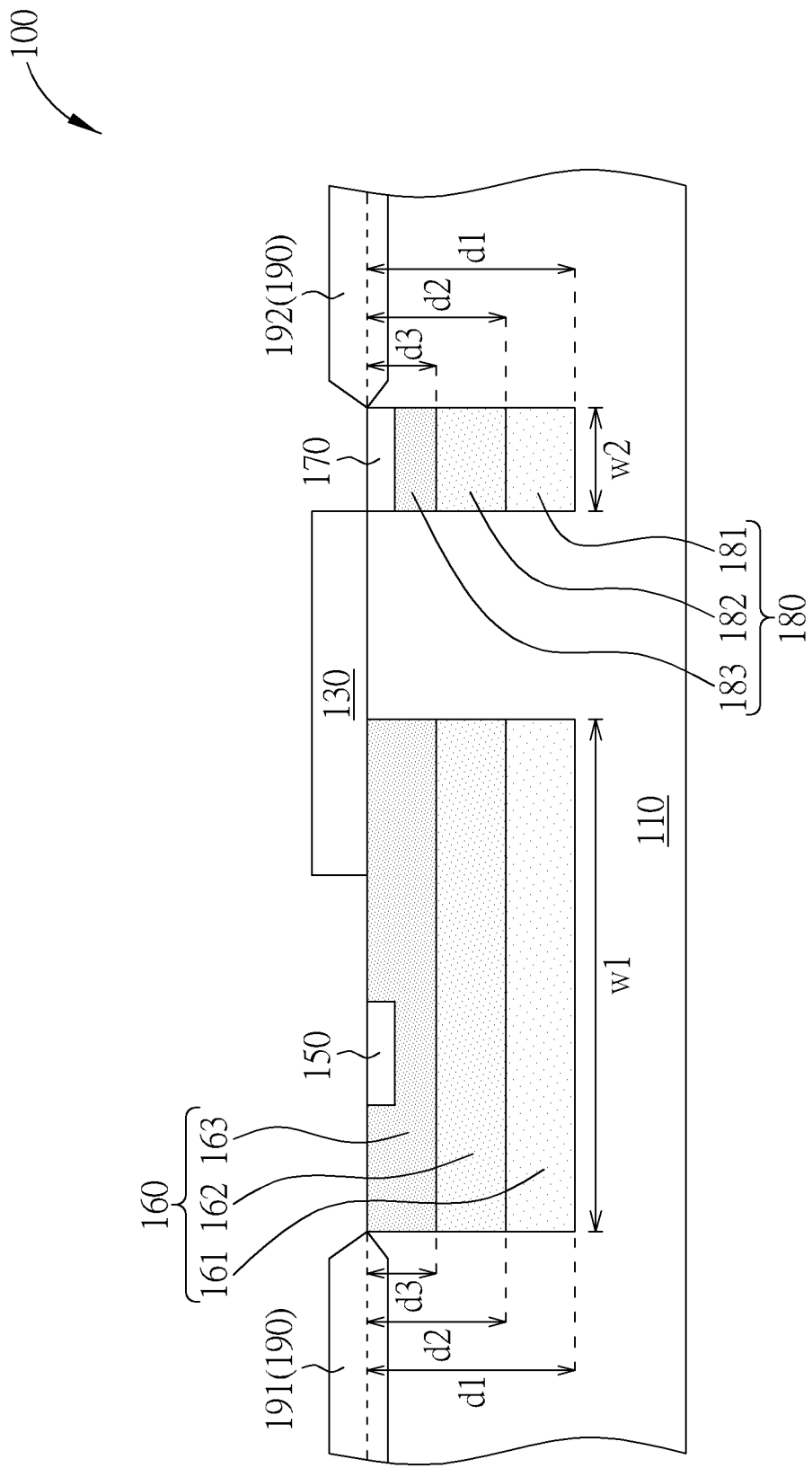
FIG. 1 is a schematic diagram illustrating a cross-sectional view of a high-voltage semiconductor device according to a comparing embodiment of the present disclosure.

For better understanding of the presented disclosure, preferred embodiments will be described in detail. The preferred embodiments of the present disclosure are illustrated in the accompanying drawings with numbered elements.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 200, preferably within 100, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Please refer to FIG. 1, which illustrates a cross-sectional view of a high-voltage semiconductor device 100 according to the comparing embodiment of the present disclosure. In the present disclosure, the high-voltage semiconductor device 100 refers to a semiconductor device having an operating voltage higher than about 20 volts (V), such as 30 volts. The high-voltage semiconductor device 100 includes a substrate 110, a gate structure 130, a drain 150, a source 170 and at least one insulating structure 190. In one embodiment, the substrate 110 may include a silicon substrate, an epitaxial silicon substrate, a silicon germanium substrate, a silicon carbide substrate or a silicon-on insulator (SOI) substrate, but is not limited thereto. The substrate 110 for example includes a first conductive type (such as P-type), and the gate structure 130 is disposed on the substrate 110, and the drain 150 and the source 170 are disposed in the substrate 110, at two opposite sides of the gate structure 130 respectively in a horizontal direction (not shown in the drawings, such as the x-direction). In one embodiment, the gate structure 130 may include a polysilicon gate, a metal gate or a gate being formed by other suitable materials, and the drain 150 and the source 170 are doped regions having a second conductive type (such as N-type) respectively, wherein, the second conductive type (N-type) is complementary to the first conductive type (P-type). In another embodiment, the first conductive type may be N-type and the second conductive type may be P-type optionally, so that, p-type doped regions may be formed to configure as the drain and the source, so as to obtain the high-voltage semiconductor device in various types.

At least one insulating structure 190 is also disposed on the substrate 110, and the insulating structure 190 may be a field oxide (FOX) layer as shown in FIG. 1, which is formed for example through a local oxidation of silicon (LOCOS) process, but is not limited thereto. The insulating structure 190 may also be an insulating element (such as a shallow trench isolation) which is formed through a deposition process or other suitable processes, but is not limited thereto. In the present embodiment, two insulating structures 191, 192 are respectively formed at two opposite sides of the gate structures 130, so that, the source 170 may be disposed between the insulating structure 192 and the gate structure 130, and the drain 150 may be disposed between the insulating structure 191 and the gate structure 130 without directly contacting the insulating structure 191 and/or the gate structure 130, as shown in FIG. 1. However, people skilled in the art should fully understand the locations and number of the aforementioned insulating structures 190 are only for example, and the specific location and the number of the insulating structures 190 may be further adjustable based on practical product requirements.

The high-voltage semiconductor device 100 further includes a drain doped region 160 and a source doped region 180, disposed below the drain 150 and the source 170 respectively. The drain doped region 160 and the source doped region 180 may both be doped regions with the second conductive type (such as N-type), wherein the doping concentrations of the drain doped region 160 and the source doped region 180 are smaller than the doping concentrations of the drain 150 and the source 170. In the present embodiment, the drain doped region 160 and the source doped region 180 include an asymmetric structure. For example, a width w1 of the drain doped region 160 may be greater than a width w2 of the source doped region 180 along the horizontal direction, as shown in FIG. 1. Under the disposing example of the present embodiment, the source doped region 180 is also disposed between the gate structure 130 and the insulating structure 192, with the sidewalls of the source doped region 180 and the source 170 being both vertical aligned with one side sidewall of the gate structure 130. The drain doped region 160 extends from one side of the insulating structure 191 to the bottom of the gate structure 130, with the sidewall of the drain doped region 160 being not vertical aligned with the sidewall the drain 150 or the sidewall of the gate structure 130. In other words, in the present embodiment, the drain 150 is disposed within the drain doped region 160 in the horizontal direction with the drain 150 being surrounded thereby, so that, the drain doped region 160 may be configured as a drift region of the high-voltage semiconductor device 100. However, the drain doped region 160 and source doped region 180 are not limited to be disposed as the aforementioned structures, and in another embodiment, the drain doped region and source doped region may also include symmetric structures, for example with the drain doped region and the source doped region having the same width in the horizontal direction.

Precisely speaking, the drain doped region 160 may further include a first drain doped region 161, a second drain doped region 162 and a third drain doped region 163 sequentially arranged from bottom to top. The first drain doped region 161, the second drain doped region 162 and the third drain doped region 163 may include the same dopant or different dopants, respectively, wherein the dopant may be a five-valence atom such as phosphorus (P), arsenic (As) or tellurium (Ti), but not limited thereto. The first drain doped region 161 includes a relative greater depth d1 in the substrate 110 and a relative smaller doping concentration, for example being about $5 \times 10^{13}$ to $2.0 \times 10^{14}$ ions in per cubic centimeter ($5 \times 10^{13}$-$2.0 \times 10^{14}$ ions/cm$^3$), and the third drain doped region 163 includes a relative smaller depth d3 in the substrate 110 and a relative greater doping concentration, for example being about $3 \times 10^{14}$ to $9.0 \times 10^{14}$ ions in per cubic centimeter (3.0-9.0×10$^{14}$ ions/cm$^3$). The depth d2 of the second drain doped region 162 is between the depth d1 of the first drain doped region 161 and the depth d3 of the third drain doped region 163, and the doping concentration of the second drain doped region 162 is also between the doping concentrations of the first drain doped region 161 and the third drain doped region 163, for example being about 1.0×10$^{14}$ to 5.0×10$^{14}$ ions in per cubic centimeter (1.0-5.0× 10$^{14}$ ions/cm$^3$), but is not limited thereto. In one embodiment, the depth d1 of the first drain doped region 161 is for example 0.8 micrometers (μm) to 1.2 micrometers, the depth d2 of the second drain doped region 162 is for example 0.4 to 0.8 micrometers, and the depth d3 of the third drain doped region 163 is for example 0.1 to 0.3 micrometers, but is not limited thereto. In other words, the overall doping concentration of the drain doped region 160 gradually decreases as the increased depth of the drain doped region 160 within the substrate 110.

On the other hand, the source doped region 180 also includes a first source doped region 181, a second source doped region 182 and a third source doped region 183 sequentially arranged from bottom to top. The first source doped region 181, the second source doped region 182 and the third source doped region 183 may include the same dopant or different dopants, respectively, wherein the dopant may be a five-valence atom such as phosphorus, arsenic or tellurium, but not limited thereto. Also, the depth d1 of the first source doped region 181, the depth d2 of the second source doped region 182 and the depth d3 of the third source doped region 183 are respectively the same as the depth d1 of the first drain doped region 161, the depth d2 of the second drain doped region 162 and the depth d3 of the third drain doped region 163, and the doping concentrations of the first source doped region 181, the second source doped region 182 and the third source doped region 183 are also respectively the same as the doping concentrations of the first drain doped region 161, the second drain doped region 162 and the third drain doped region 163. Thus, during fabricating the high-voltage semiconductor device 100, the source doped region 180 and the drain doped region 160 may be simultaneously formed through a single mask and through the same implanting process, but not limited thereto.

Through these arrangements, the high-voltage semiconductor device 100 according to the comparing embodiment of the present disclosure may have sufficient voltage tolerability because of the gradually decreased doping concentration of the drain doped region 160 from top to bottom. However, in some situations, the high-voltage semiconductor device 100 may have the hot carrier injection issue, so that the substrate current (Isub) which passes through the substrate 110, or the gate current (Ig) which passes through the gate structure 130 may be excessed high, thereby resulting in poor device reliability. Although the hot carrier injection issue may be generally improved by further reducing the overall doping concentration of the drain doping region 160, the further reduced doping concentration of the drain doping region 160 may further lead to Kirk effect and decrease the breakdown voltage (Vth) thereof, thereby still resulting in poor device reliability of the high voltage semiconductor device 100.

In this way, people skilled in the arts should easily realize the high-voltage semiconductor device in the present disclosure is not limited to the aforementioned embodiment, and may further include other examples or variations. The following description will detail the different embodiments of the high-voltage semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 2:
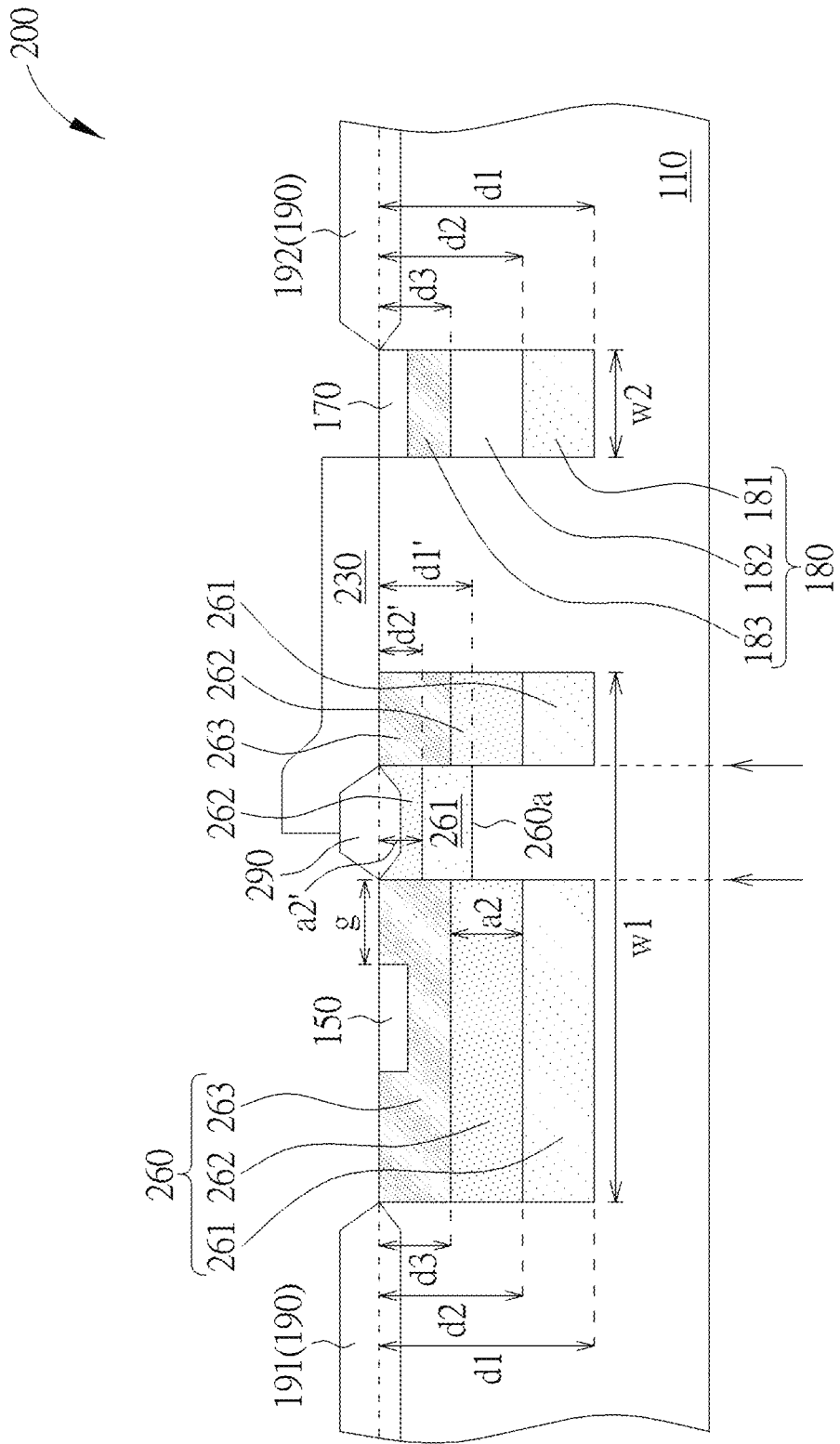
FIG. 2 s a schematic diagram illustrating a cross-sectional view of a high-voltage semiconductor device according to a first embodiment of the present disclosure.

Please refer to FIG. 2, which illustrates a cross-sectional view of a high-voltage semiconductor device 200 according to the first embodiment of the present disclosure. The structure of the high-voltage semiconductor device 200 of the present embodiment is substantially similar to the high-voltage semiconductor device 100 in the aforementioned first embodiment, and which also includes the substrate 110, the drain 150, the source 170, the source doped region 180 and the insulating structures 190. All similarity between the present embodiment and the aforementioned comparing embodiment will not be redundant described hereinafter. The difference between the present embodiment and the aforementioned comparing embodiment is mainly in that an insulating structure 290 is additionally disposed under a gate structure 230, adjacent to the drain 150 side, wherein, a portion of a drain doped region 260 which extends below the insulating structure 290 and the gate structure 230 may therefore obtain a discontinuous bottom surface 260a.

Precisely speaking, the insulating structure 290 is also disposed on the substrate 110, and the insulating structure 290 may preferably be a field oxide layer (as shown in FIG. 2) which is simultaneously formed while forming the insulating structures 190. Otherwise, the insulating structure may also be other suitable insulating elements, but not limited thereto. In the present embodiment, the drain doped region 260 also extends from one side of the insulating structure 191 to the bottom of the gate structure 230, so that, the drain 150 may be disposed within the drain doped region 260 in the horizontal direction with the periphery of the drain 150 being surrounded by the drain doped region 260 thereby. The drain 150 of the present embodiment does not directly contact the gate structure 230, as well as the insulating structure 290 disposed under the gate structure 230, and the drain 150 is spaced to the insulating structure 290 by a portion of the drain doped region 260 (namely, a portion of a third drain doped region 263), with a space "g" between the drain 150 and the insulating structure 290 being about 1 micrometer to 2.5 micrometers, preferably being about 1.5 micrometers to 2 micrometers, but not limited thereto.

In one embodiment, the drain doped region 260 may further include a first drain doped region 261, a second drain doped region 262 and the third drain doped region 263 sequentially arranged from bottom to top. The first drain doped region 261, the second drain doped region 262 and the third drain doped region 263 may include the same dopant or different dopants respectively, wherein the dopant may also be a five-valence atom such as phosphorus, arsenic or tellurium, but not limited thereto. The doping concentrations of the first drain doped region 261, the second drain doped region 262 and the third drain doped region 263 may be substantially the same as the doping concentrations of the first drain doped region 161, the second drain doped region 162 and the third drain doped region 163 of the aforementioned comparing embodiment, which will not be redundantly described hereinafter. According, the overall doping concentration of the drain doped region 260 also gradually decreases as the increased depth of the drain doped region 260 within the substrate 110. However, in another embodiment, the drain doped region may also include other numbers of doped regions, or may be consisted of a single doped region with gradually increased doping concentration from bottom to top.

It is noted that, in the present embodiment, a portion of the first drain doped region 261 (for example the portion being disposed below the drain 150) may include a depth substantially the same as the depth d1 of the first drain doped region 161 in the aforementioned comparing embodiment, a portion of the second drain doped region 262 (for example the portion being disposed below the drain 150) may include a depth substantially the same as the depth d2 of the second drain doped region 162 in the aforementioned comparing embodiment, and the third drain doped region 263 may include a depth substantially the same as the depth d3 of the third drain doped region 163 in the aforementioned comparing embodiment, for example, with the depth d1 of the portion of the first drain doped region 261 being about 0.8-1.2 micrometers, with the depth d2 of the portion of the second drain doped region 262 being about 0.4-0.8 micrometers, and with the depth d3 of the third drain doped region 263 being about 0.1-0.3, but is not limited thereto. On the other hand, another portion of the first drain doped region 261 (for example the portion being disposed below the insulating structure 290) and another portion of the second drain doped region 262 (for example the portion being disposed below the insulating structure 290) may respectively include relative smaller depths d1', d2'. Meanwhile, due to the shielding of the insulating structure 290, the vertical doping range a2' of the second drain doped region 262 located below the insulating structure 290 is obviously smaller than the vertical doping range a2 of the second drain doped region 262 located below the drain 150, as shown in FIG. 2. Furthermore, also due to the shielding of the insulating structure 290, the third drain doped region 263 is only formed under the drain 150 and a portion of the gate structure 230, instead of being formed under the insulating structure 290. Since there is the difference in depth or in vertical doping range between the portions of the aforementioned first drain doped region 261 and the second drain doped region 262 under the insulating structure 290, and the another portions of the aforementioned first drain doped region 261 and the second drain doped region 262, the drain doped region 260 may therefore include a relative smaller depth d1' under the insulating structure 290. Thus, the drain doped region 260 has a discontinuous bottom surface 260a in an overall manner, as shown in FIG. 2. Also, another portion of the drain doped region 260 is disposed under the gate structure 230 (only under the gate structure 230 but not under the gate structure 230 and the insulating structure 290 at the same time), and which may substantially include the same depths d1, d2, d3 and the same doping range as those of the aforementioned drain doped region 160. Namely, the bottom surface of the drain doped region 260 which is under the gate structure 230 may be deeper than the bottom surface of the drain doped region 260 which is under the insulating structure 290. In other words, the bottom surface of every portion of the drain doped region 260 does not locate at the same horizontal surface, the partial bottom surface of the drain doped region 260 which is adjacent to the bottom of the insulating structure 290 may discontinuously steeply raise or steeply fall, and the drain doped region 260 may obtain the discontinuously bottom surface 260a in an overall manner. The drain doped region 260 may further present a junction having an obvious dislocation between the portion of the drain doped region 260 which is adjacent to the bottom of the insulating structure 290, and other portions of the drain doped region 260, and the junction is marked by an array as shown in FIG. 2.

Figure 3:
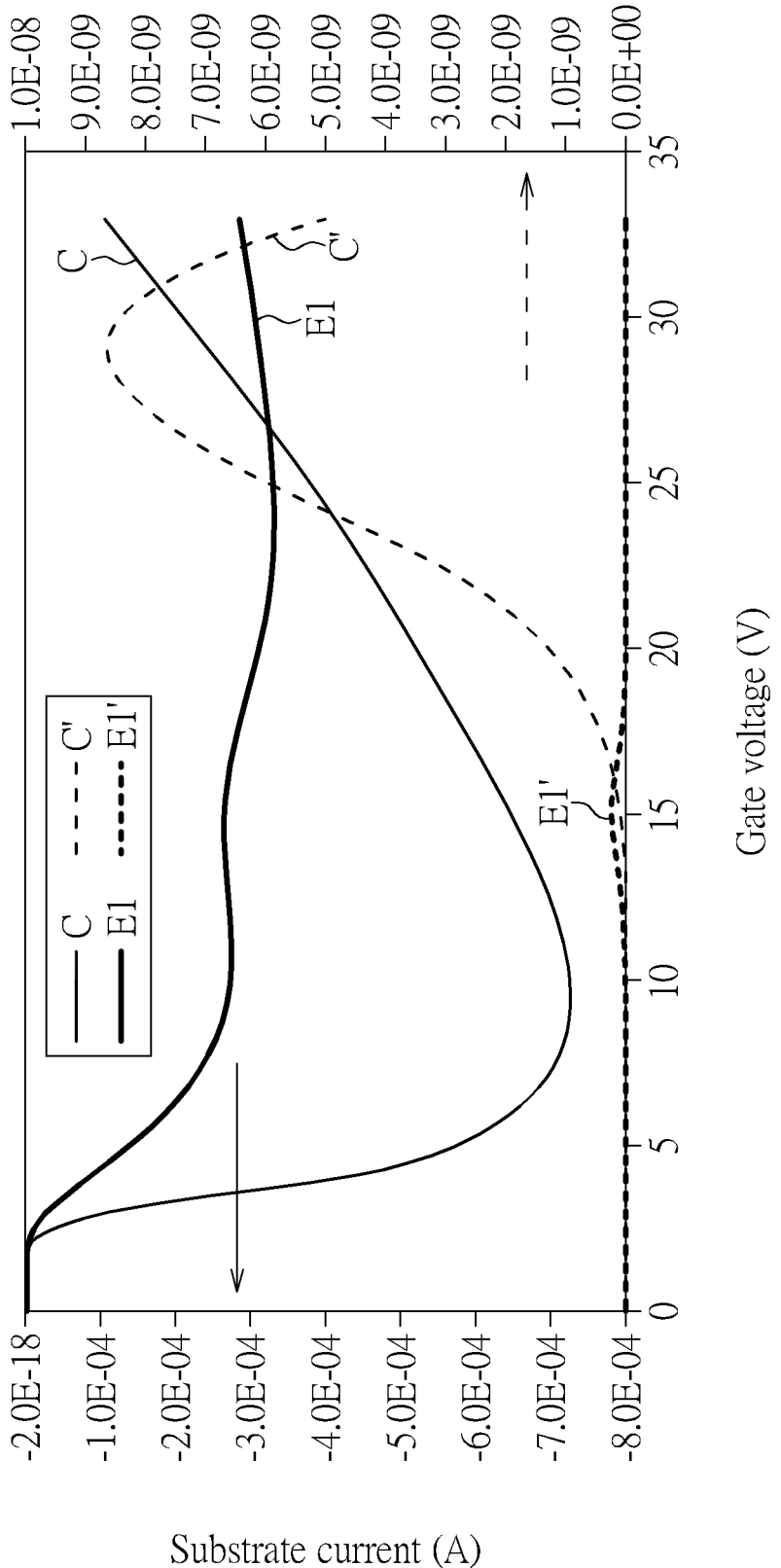
FIG. 3 is a schematic diagram illustrating a line chart of the substrate current or the gate current related to the gate voltage in the high-voltage semiconductor devices according to the comparing embodiment and the first embodiment of the present disclosure.

Through these arrangements, the high-voltage semiconductor device 200 according to the first embodiment of the present disclosure may have sufficient voltage tolerability because of the gradually decreased doping concentration of the drain doped region 260, as well as the discontinuous bottom surface 260a at the bottom of the drain doped region 260. Also, the discontinuous bottom surface 260a at the bottom of the drain doped region 260 may further improve the hot carrier injection issue effectively. Please refer to FIG. 3, in which, the relationship between the gate voltage (Vg, in X-axis) and the substrate current (Isub, in Y-axis) is shown by solid curves "C" and "E1", and the relationship between the gate voltage and the gate current (Ig, in Y-axis) is shown by dashed curves "C"' and "E1"'. In the high-voltage semiconductor device 200, the substrate current which is indicated by the solid curve "E1" is lower than the substrate current of the comparing embodiment which is indicated by the solid curve "C", at the maximum value of the substrate current (being about 10 volts). Moreover, in the high-voltage semiconductor device 200, the gate current which is indicated by the dashed curve "E1"' is lower than the gate current of the comparing embodiment which is indicated by the dashed curve "C"', at the maximum value of the gate current (being about 30 volts). Accordingly, the high-voltage semiconductor device 200 enables to obtain better device reliability.

Figure 4:
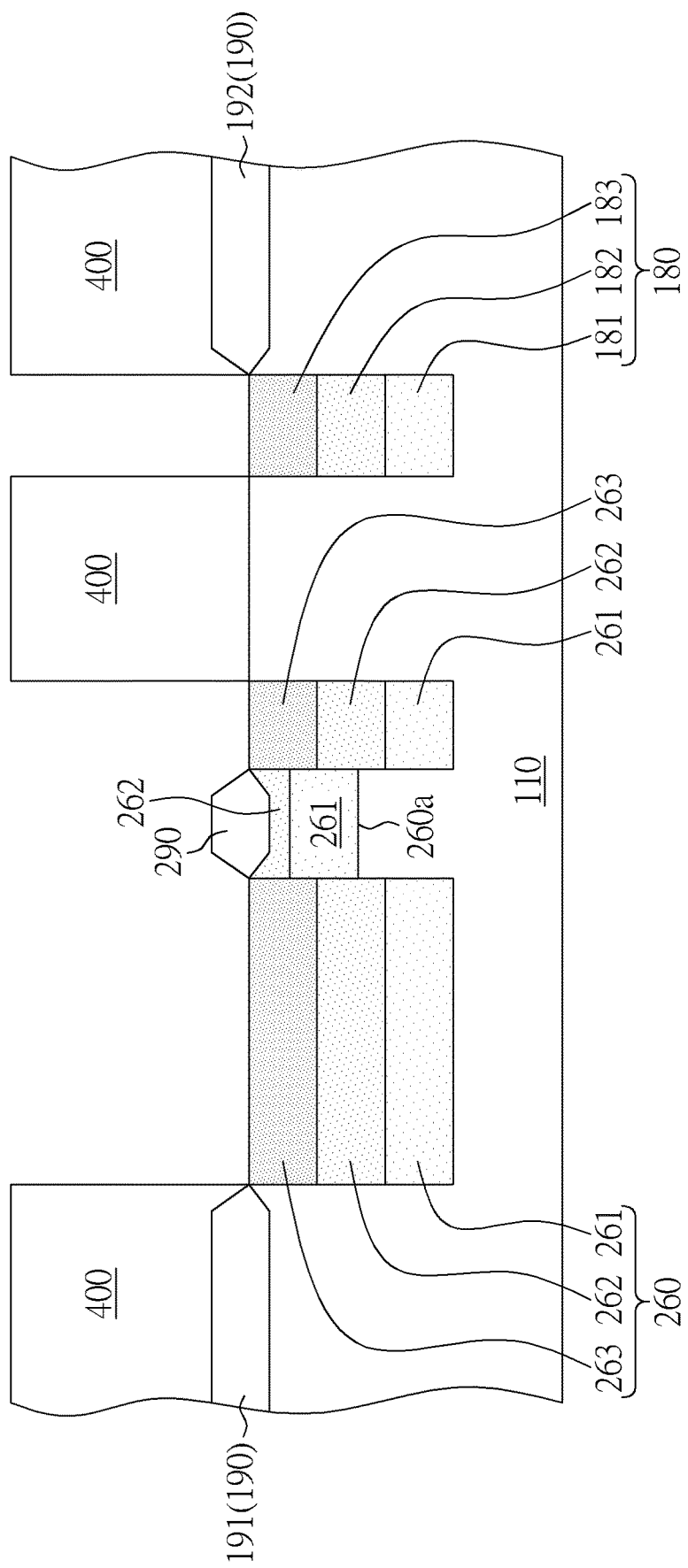
FIG. 4 to FIG. 5 are schematic diagrams illustrating cross-sectional views of a high-voltage semiconductor device according to the first embodiment during a fabricating process of the present disclosure.
Figure 5:
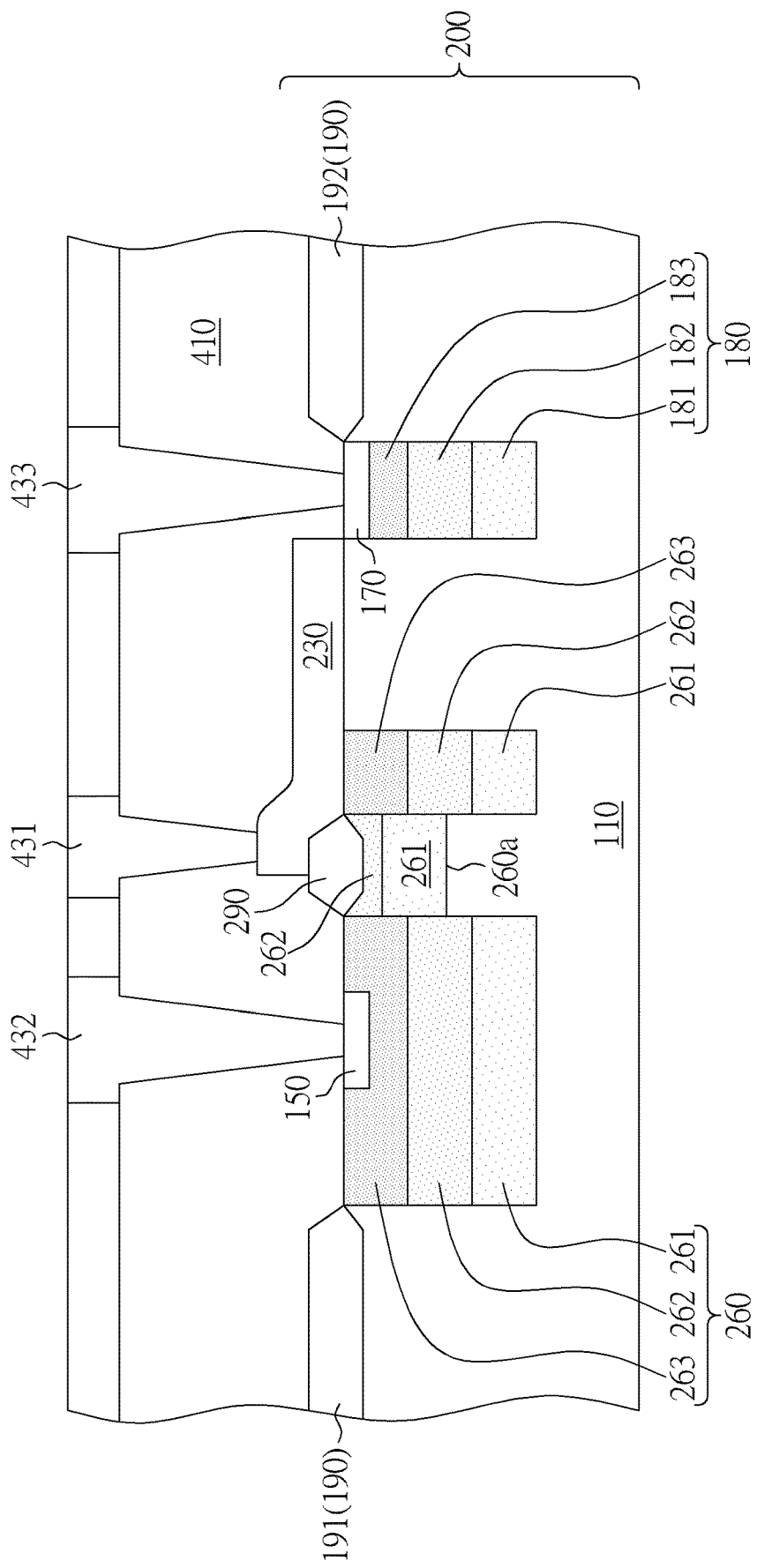

Please refer to FIG. 4 to FIG. 5, which illustrate cross-sectional views of the high-voltage semiconductor device 200 according to the first embodiment of the present disclosure during the fabricating process. Firstly, as shown in FIG. 4, a substrate 110 is provided, and the insulating structures 190, 290 are simultaneously formed on the substrate 110. Next, a mask 400 is formed on the substrate 110 to expose a portion of the substrate 110 and the insulating structure 290, and at least one implanting process is performed through the mask 400, to form the drain doped region 260 and the source doped region 180 in the substrate 110.

It is noted that, the forming position of the drain doped region 260 partially overlaps with the insulating structure 290, so that, the thickness of the insulating structure 290 may affect the penetrating degree of implanting energy while performing the implanting process, thereby further affecting the depth and/or the vertical doping range of the drain doped region 260 located below the insulating structure 290. As an example, if the ion implanting is carried out under a relative higher implanting energy (for example being about 700 keV to 800 keV), the shielding of the insulating structure 290 may affect the depth of the ion distribution, and thus, a shallow doped region, such as the first drain doped region 261 as shown in FIG. 2, may be formed under the insulating structure 290. On the other hand, if the ion implanting is carried out under a relative lower implanting energy (for example being about 450 keV to 550 keV), the shielding of the insulating structure 290 may prevent at least a portion of ions from implanted successfully, and thus, a doped region with a smaller depth and a smaller vertical doping range, such as the second drain doped region 262 as shown in FIG. 2, may be formed under the insulating structure 290. Accordingly, there is the junction having an obvious dislocation may be presented between the portion of the drain doped region 260 which is formed below the insulating structure 290, and other portions of the drain doped region 260, so that, the drain doped region 260 may obtain the discontinuous bottom surface 260a in an overall manner, as shown in FIG. 4. Moreover, if the ion implanting is carried out under a further lower implanting energy (for example being about 100 keV to 200 keV), the shielding of the insulating structure 290 may completely block ions implanting, and thus, a doped region, such as the third drain doped region 263 as shown in FIG. 2, may not be formed under the insulating structure 290.

In the present embodiment, a first implanting process may be firstly performed for example under an implanting energy being about 700-800 keV and preferably being about 750 keV, to form the first drain doped region 261 and the first source doped region 181, and then, a second implanting process may be performed for example under an implanting energy being about 450-550 keV and preferably being about 500 keV, to form the second drain doped region 262 and the second source doped region 182, and finally, a third implanting process is performed for example under an implanting energy being about 100-200 keV and preferably being about 120 keV, to form the third drain doped region 263 and the third source doped region 183. Accordingly, the first drain doped region 261, the second drain doped region 262, and the third drain doped region 263 are sequentially formed to consist the drain doped region 260, and the first source doped region 181, the second source doped region 182, and the third source doped region 183 are sequentially formed to consist the source doped region 180. However, people skilled in the arts should easily realize that the number and the sequence of the implanting process are not limited to the aforementioned embodiment, and which may be further adjusted based on practical product requirements. For example, although the above embodiment chooses to firstly perform the implanting process with the higher implanting energy to form the doped region in a greater depth, in other embodiments, the implanting process with the lower implanting energy may also be performed at first to form the doped region in a smaller depth. Otherwise, the drain doped region and the source doped region may also be form by carrying out a single implanting process or other numbers of ion implanting processes.

Following these, as shown in FIG. 5, the gate structure 230, the drain 150 and the source 170 are sequentially formed. The gate structure 230 is formed on a portion of the insulating structure 290, to partially overlap with the drain doped region 260 underneath. The drain 150 and the source 170 are respectively formed within the drain doped region 260 and the source doped region 180 which are at the two opposite sides of the gate structure 230. According to these, the high-voltage semiconductor device 200 of the aforementioned first embodiment is formed, wherein, the detail components thereof are all mentioned above and as shown in FIG. 2, which may not be redundant described hereinafter. The high-voltage semiconductor device 200 may sufficiently improve the hot carrier injection issue effectively, and also avoid the dropping of breakdown voltage thereof because of the discontinuous bottom surface 260a at the bottom of the drain doped region 260. Thus, the fabricating process of the present embodiment is beneficial to obtain a high-voltage semiconductor device with better device reliability. After that, at least one dielectric layer 410 and a plurality of plugs 431, 432, 433 may be formed on the substrate 110, as shown in FIG. 5, to electrically connect to the gate structure 230, the drain 150 and the source 170 respectively. Then, the high-voltage semiconductor device 200 may further electrically connect to an external circuit (not shown in the drawings) thereby.

It is also noted that, although the fabricating process of the high-voltage semiconductor device in the present embodiment is exemplified by firstly forming the drain doped region 260 and the source doped region 180, and then forming the gate structure 230, the practical fabricating process of the high-voltage semiconductor device is not limited to the aforementioned forming sequence. In another embodiment, after forming the insulating structure 290, a gate structure (not shown in the drawings) may be optionally formed on the substrate 110 at first to partially cover the insulating structure 290, and then, a drain doped region (not shown in the drawings) and a source doped region (not shown in the drawings) are formed through a mask (not shown in the drawings). Through these steps, the formation of the drain doped region may be double shielded by the insulating structure 290 and the gate structure 230, so that the drain doped region may obtain a more complicated discontinuous bottom surface (not shown in the drawings) thereby. Then, the high-voltage semiconductor device formed accordingly may also have functions on improving the hot carrier injection issue and avoiding the dropping of the breakdown voltage thereof. Furthermore, although the doping range of each of the aforementioned doped regions (such as the drain doped region 260 or the source doped region 180) is exemplified by making sidewalls of each of the aforementioned doped regions being vertical aligned with the sidewalls of the mask 400 or the sidewalls of components (such as the insulating structures 190) disposed at two sides of the aforementioned doped regions, a practical doping range (not shown in the drawings) of each of the aforementioned doped regions may further diffuse to the bottom of the components disposed at two sides of the aforementioned doped regions during a thermal drive-in process is performed subsequently. These aforementioned other processes or steps may also be within the scope of the present disclosure.

Figure 6:
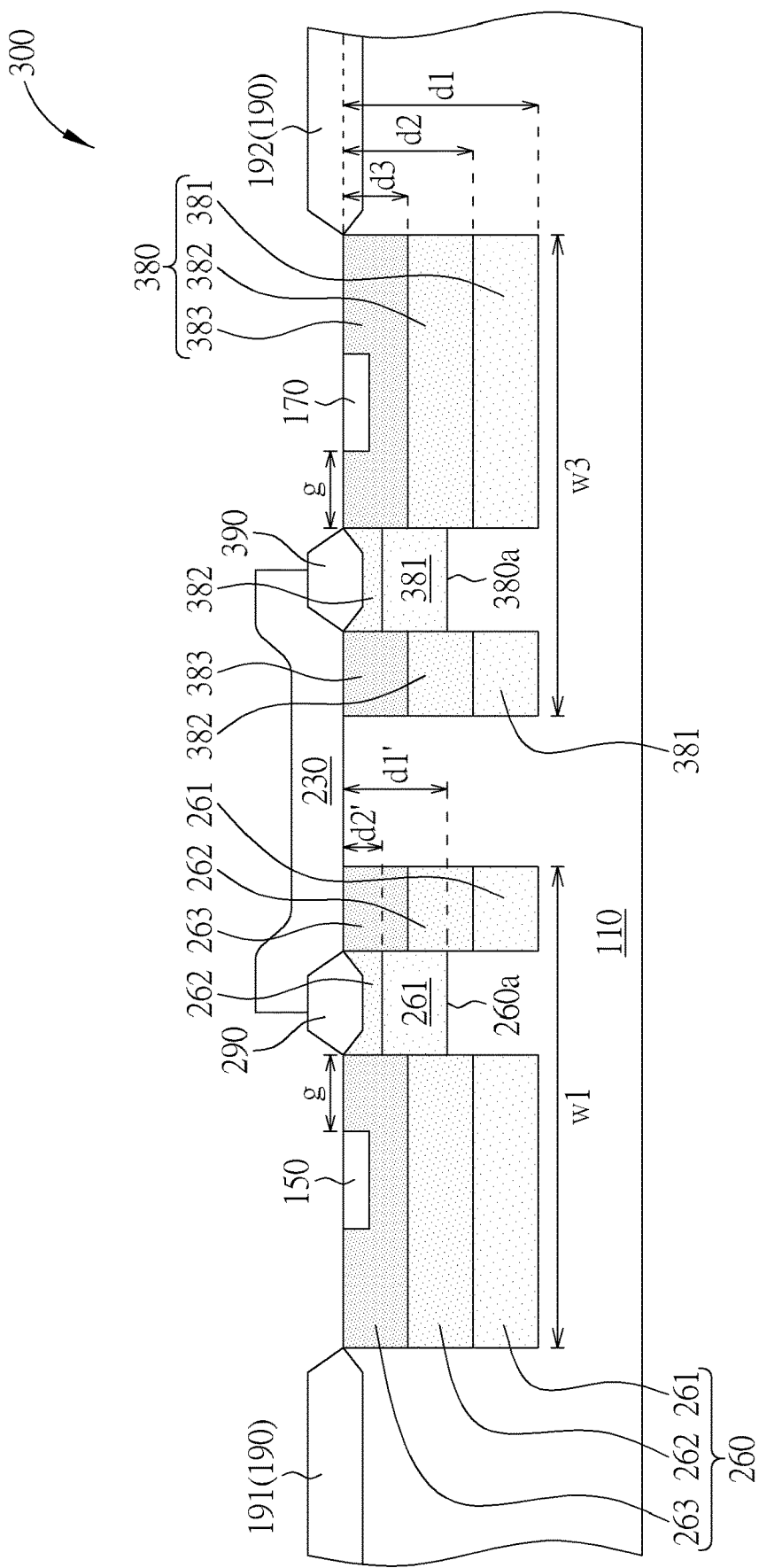
FIG. 6 is a schematic diagram illustrating a cross-sectional view of a high-voltage semiconductor device according to a second embodiment of the present disclosure.

Please refer to FIG. 6, which illustrates a cross-sectional view of a high-voltage semiconductor device 300 according to a second embodiment of the present disclosure. The structure of the high-voltage semiconductor device 300 of the present embodiment is substantially similar to those within the aforementioned first embodiment as shown in FIG. 2. All similarity between the present embodiment and the aforementioned first embodiment will not be redundant described hereinafter. The difference between the present embodiment and the aforementioned first embodiment is mainly in that the drain doped region 260 and a source doped region 380 in the present embodiment may have symmetric structures, such as having the same widths.

Precisely speaking, the source doped region 380 is also disposed between a gate structure 230 and the insulating structure 192, and a width w3 of the source doped region 380 is for example the same as the width w1 of the drain doped region 260. In the present embodiment, the source doped region 380 extends from a side of the insulating structure 192 to the bottom of the gate structure 230, so that, the source 170 may be disposed within the source doped region 380 in the horizontal direction with the periphery of the source 170 being surrounded by the source doped region 380. Accordingly, the source 170 is spaced to an insulating structure 390 by a portion of the source doped region 380 (namely, a portion of a third source doped region 383), with a space "g" between the source 170 and the insulating structure 390 being about 1-2.5 micrometers, preferably being about 1.5-2 micrometers, but not limited thereto. With these arrangements, the source 170 of the present embodiment may also configure as a drift region of the high-voltage semiconductor device 300.

Also, it is noted that, the insulating structure 390 is additionally disposed under the gate structure 230, adjacent to the source 170 side, so that, a portion of the source doped region 380 which extends to the bottoms of the insulating structure 390 and the gate structure 230 may therefore obtain a discontinuous bottom surface 380a. The fabricating process of the insulating structure 390 is substantially the same as the fabricating process of the insulating structure 290, and which will not be redundantly described hereinafter. The source doped region 380 also includes a first source doped region 381, a second source doped region 382 and the third source doped region 383 sequentially arranged from bottom to top. Similar to the drain doped region 260 disposed at the left side of the gate structure 230, the formation of a portion of the source doped region 380 is shielded by the insulating structure 390, thus that, the depths or the doping range of the first source doped region 381 and the second source doped region 382 under the insulating structure 390 may be affected thereby. In this way, the bottom surface of every portion of the source doped region 380 does not locate at the same horizontal surface, the partial bottom surface of the source doped region 380 which is adjacent to the bottom of the insulating structure 390 may discontinuously steep raise or steep fall, and the source doped region 380 may obtain the discontinuously bottom surface 380a in an overall manner, as shown in FIG. 6. The depth of the portion of the first source doped region 381 which is under the source 170 may be substantially the same as the depth d1 of the aforementioned first drain doped region 261 under the drain 150, the depth of the portion of the second source doped region 382 which is under the source 170 may be substantially the same as the depth d2 of the aforementioned second drain doped region 262 under the drain 150, and the depth of the portion of the third source doped region 383 which is under the source 170 may be substantially the same as the depth d3 of the aforementioned third drain doped region 263 under the drain 150. On the other hand, the depth of the portion of the first source doped region 381 which is under the insulating structure 390 is substantially the same as the depth d1' of the aforementioned first drain doped region 261 under the insulating structure 290, and the depth of the portion of the second source doped region 382 which is under the insulating structure 390 is substantially the same as the depth d2' of the aforementioned second drain doped region 262 under the insulating structure 290. The further details of the source doped region 380 are all similar with those of the drain doped region 260, which will not be redundant described hereinafter.

Through these arrangements, the high-voltage semiconductor device 300 according to the second embodiment of the present disclosure may have sufficient voltage tolerability because of the gradually decreased doping concentrations of the drain doped region 260 and the source doped region 380, as well as the discontinuous bottom surfaces 260a, 380a at the bottoms of the drain doped region 260 and the source doped region 380 respectively. Thus, the high-voltage semiconductor device 300 may sufficiently improve the hot carrier injection issue and prevent from the dropping of breakdown voltage, so as to obtain better device reliability. The above description is only one of the purposes of the present disclosure and it is not intended to limit the scope of present disclosure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a high-voltage semiconductor device, comprising:
    providing a substrate;
    forming an insulating structure on the substrate;
    after forming the insulating structure, forming a drain doped region in the substrate, partially under the insulating structure, wherein the drain doped region comprises a discontinuous bottom surface under the insulating structure;
    forming a drain in the drain doped region, wherein the drain doped region further comprises a first portion being directly in contact with a bottom surface of the gate structure, and a second portion being formed between the drain and the isolating structure, and the discontinuous bottom surface is formed between the first portion and the second portion of the drain doped region in a horizontal direction; and
    forming a gate structure on the substrate.

2. The method of forming a high-voltage semiconductor device according to claim 1, wherein the gate structure is formed on a portion of the insulating structure.

3. The method of forming a high-voltage semiconductor device according to claim 1, wherein a depth of the drain doped region formed under the insulating structure is smaller than a depth of other portions of the drain doped region.

4. The method of forming a high-voltage semiconductor device according to claim 3, wherein the forming of the drain doped region further comprises:
    performing an implanting process under an implanting energy of 700 keV to 800 keV.

5. The method of forming a high-voltage semiconductor device according to claim 1, wherein a vertical doping range of the drain doped region under the insulating structure is smaller than a vertical doping range of other portions of the drain doped region.

6. The method of forming a high-voltage semiconductor device according to claim 1, wherein the discontinuous bottom surface extends between two opposite edges of the insulating structure in a horizontal direction.

7. The method of forming a high-voltage semiconductor device according to claim 1, wherein the forming of the drain doped region further comprises:
    performing a first implanting process under a first implanting energy;
    after the first implanting process, performing a second implanting process under a second implanting energy; and
    after the second implanting process, performing a third implanting process under a third implanting energy, wherein the first implanting energy is higher than the second implanting energy and the second implanting energy is higher than the third implanting energy.

8. The method of forming a high-voltage semiconductor device according to claim 7, wherein the first implanting energy is range from 700 keV to 800 keV, the second implanting energy is range from 450 keV to 550 keV and the third implanting energy is range from 100 keV to 200 keV.

9. The method of forming a high-voltage semiconductor device according to claim 7, wherein a third drain doped region is formed in the third implanting process, and the third drain doped region is not formed under the insulating structure.

10. The method of forming a high-voltage semiconductor device according to claim 7, wherein a first drain doped region and a second drain doped region are respectively formed in the first implanting process and the second implanting processing, and the first drain doped region and the second drain doped region respectively comprise a discontinuous bottom surface under the insulating structure.

11. The method of forming a high-voltage semiconductor device according to claim 10, wherein a vertical doping range of the first drain doped region under the insulating structure is smaller than a vertical doping range of other portions of the first drain doped region.

12. The method of forming a high-voltage semiconductor device according to claim 10, wherein a vertical doping range of the second drain doped region under the insulating structure is smaller than a vertical doping range of other portions of the second drain doped region.

13. The method of forming a high-voltage semiconductor device according to claim 1, further comprising:

after forming the insulating structure, forming a source doped region partially under another insulating structure, wherein the source doped region comprises a discontinuous bottom surface under the another insulating structure.

14. The method of forming a high-voltage semiconductor device according to claim 13, further comprising:

forming a source in the source doped region, a portion of the source doped region is disposed between the source and the another insulating structure.

15. The method of forming a high-voltage semiconductor device according to claim 13, wherein the gate structure, the drain and the source are formed after forming the drain doped region and the source doped region.

16. The method of forming a high-voltage semiconductor device according to claim 10, wherein a distance between a top surface of the substrate and the discontinuous bottom surface of the first drain doped region is smaller than a depth of the second drain doped region under the drain.

* * * * *